(12) United States Patent
Son

(10) Patent No.: US 10,797,127 B2
(45) Date of Patent: *Oct. 6, 2020

(54) ELECTROLUMINESCENT DISPLAY DEVICE

(71) Applicant: LG Display Co., Ltd., Seoul (KR)

(72) Inventor: Hoon-Sok Son, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/216,684

(22) Filed: Dec. 11, 2018

(65) Prior Publication Data

US 2019/0198600 A1 Jun. 27, 2019

(30) Foreign Application Priority Data

Dec. 27, 2017 (KR) ........................ 10-2017-0181416

(51) Int. Cl.
*H01L 27/32* (2006.01)
*H01L 51/50* (2006.01)
*H01L 51/52* (2006.01)

(52) U.S. Cl.
CPC ...... *H01L 27/3276* (2013.01); *H01L 51/5012* (2013.01); *H01L 51/5203* (2013.01); *H01L 51/524* (2013.01)

(58) Field of Classification Search
CPC .................................................. H01L 27/3276
See application file for complete search history.

(56) References Cited

U.S. PATENT DOCUMENTS

| 8,143,782 B2* | 3/2012 | Kim .................. H01L 51/524 |
|---|---|---|
| | | 313/504 |
| 2014/0117341 A1 | 5/2014 | Song et al. |
| 2015/0070616 A1* | 3/2015 | Ogasawara ......... G02F 1/1339 |
| | | 349/43 |
| 2018/0197779 A1 | 7/2018 | Lee et al. |
| 2019/0198599 A1* | 6/2019 | Son .................. H01L 27/3276 |

* cited by examiner

*Primary Examiner* — Stephen M Bradley
(74) *Attorney, Agent, or Firm* — Seed IP Law Group LLP

(57) ABSTRACT

An electroluminescent display device includes a substrate on which a display area and a non-display area are defined. A thin film transistor is in the display area on the substrate. A light-emitting diode is connected to the thin film transistor and includes a first electrode, a light-emitting layer and a second electrode. A first link line is disposed in the non-display area and applies a first voltage to the first electrode. A second link line is spaced apart from the first link line in the non-display area. A conductive pattern is disposed in the non-display area and is connected to the second electrode to apply a second voltage. The conductive pattern has an opening corresponding to the first and second link lines.

18 Claims, 4 Drawing Sheets

ELECTROLUMINESCENT DISPLAY DEVICE

CROSS-REFERENCE TO RELATED APPLICATION

The present application claims priority from and the benefit under 35 U.S.C § 119(a) of Korean Patent Application No. 10-2017-0181416 filed on Dec. 27, 2017, which is hereby incorporated by reference in its entirety.

BACKGROUND

Technical Field

The present disclosure relates to an electroluminescent display device, and more particularly, to an electroluminescent display device capable of preventing an electrical short between signal lines.

Description of the Related Art

Recently, flat panel displays have been widely developed and applied to various fields because of their thin profile, light weight, and low power consumption.

Among the flat panel displays, electroluminescent display devices emit light due to the radiative recombination of an exciton after forming the exciton from an electron and a hole by injecting charges into a light-emitting layer between a cathode for injecting electrons and an anode for injecting holes. The electroluminescent display devices include a flexible substrate such as plastic; because they are self-luminous, the electroluminescent display devices have excellent contrast ratios; the electroluminescent display devices have a response time of several micro seconds, and there are advantages in displaying moving images; the electroluminescent display devices have wide viewing angles and are stable under low temperatures; since the electroluminescent display devices are driven by a low voltage of direct current (DC) 5V to 15V, it is easy to design and manufacture driving circuits; and the manufacturing processes of the electroluminescent display device are simple since only deposition and encapsulation steps are required.

The electroluminescent display devices are classified into a passive matrix type and an active matrix type according to a driving method. An active matrix type electroluminescent display device has been widely used for various display devices because of its low power consumption, high definition and large size.

In an active type electroluminescent display device, a thin film transistor is formed on a substrate, a light-emitting diode is formed to be connected to the thin film transistor, and the light-emitting diode selectively emits light according to on/off of the thin film transistor.

Meanwhile, the electroluminescent display device is divided into a bottom-emission type and a top-emission type according to an output direction of light emitted from the light-emitting layer. In the bottom-emission type electroluminescent display device, light emitted from the light-emitting layer is output through a substrate on which the thin film transistor and the light-emitting diode are formed, and in the top-emission type electroluminescent display device, light emitted from the light-emitting layer is output through an opposite direction to the substrate.

Since the thin film transistor and signal lines can be formed under the light-emitting diode, the top-emission type electroluminescent display device can have a larger emission area than the bottom-emission type electroluminescent display device having the same size.

The top-emission type electroluminescent display device is formed by disposing a cover substrate over the substrate on which the thin film transistor and the light-emitting diode are formed and attaching edges of the substrate and the cover substrate using a seal pattern. Particles are generated from the seal pattern during the attaching process, and there may be a problem that an electrical short between signal lines for applying different signals is generated due to the particles.

These electrical shorts may cause ignition, and a driving failure is generated. In severe cases, the electrical short causes a fire, thereby decreasing the safety.

BRIEF SUMMARY

Accordingly, the present disclosure is directed to an electroluminescent display device that substantially obviates one or more of the problems due to limitations and disadvantages of the related art.

An embodiment of the present disclosure provides an electroluminescent display device solving the electrical short problem between signal lines thereof.

Another embodiment of the present disclosure provides an electroluminescent display device preventing ignition and improving the safety.

Additional features and advantages of the present disclosure will be set forth in the description which follows, and in part will be apparent from the description, or may be learned by practice of the present disclosure. These and other advantages of the present disclosure will be realized and attained by the structure particularly pointed out in the written description as well as the appended drawings.

To achieve these and other advantages and in accordance with the purpose of the present disclosure, as embodied and broadly described herein, there is provided an electroluminescent display device that includes a substrate on which a display area and a non-display area are defined; a thin film transistor in the display area on the substrate; a light-emitting diode connected to the thin film transistor and including a first electrode, a light-emitting layer and a second electrode; a first link line disposed in the non-display area and applying a first voltage to the first electrode; a second link line spaced apart from the first link line in the non-display area; and a conductive pattern disposed in the non-display area and connected to the second electrode to apply a second voltage, the conductive pattern having an opening corresponding to the first and second link lines.

It is to be understood that both the foregoing general description and the following detailed description are by way of example and explanatory and are intended to provide further explanation of the present disclosure.

BRIEF DESCRIPTION OF THE SEVERAL VIEWS OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure.

DETAILED DESCRIPTION

Reference will now be made in detail to an embodiment of the disclosure, examples of which are illustrated in the accompanying drawings.

An electroluminescent display device according to an embodiment of the present disclosure has a display area displaying an image and a non-display area surrounding the display area, and a plurality of pixels are included in the display area. One pixel includes red, green and blue sub pixels, and a pixel region corresponding to each sub pixel can have a configuration illustrated in FIG. 1.

Figure 1:
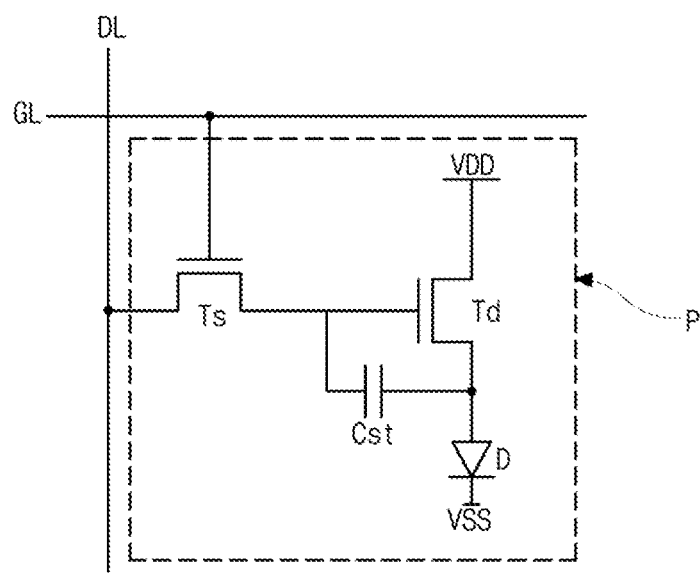
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure.

In FIG. 1, the electroluminescent display device of the present disclosure includes a gate line GL, a data line DL, a switching thin film transistor Ts, a driving thin film transistor Td, a storage capacitor Cst and a light-emitting diode D. The gate line GL and the data line DL cross over each other to define a pixel region P. The switching thin film transistor Ts, the driving thin film transistor Td, the storage capacitor Cst and the light-emitting diode D are formed in the pixel region P.

More particularly, a gate electrode of the switching thin film transistor Ts is connected to the gate line GL and a source/drain electrode of the switching thin film transistor Ts is connected to the data line DL. A gate electrode of the driving thin film transistor Td is connected to a drain/source electrode of the switching thin film transistor Ts, and a drain electrode of the driving thin film transistor Td is connected to a high voltage supply VDD. An anode of the light-emitting diode D is connected to a source electrode of the driving thin film transistor Td, and a cathode of the light-emitting diode D is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and to an electrode of the storage capacitor Cst through the switching thin film transistor Ts.

When the driving thin film transistor Td is turned on by the data signal, an electric current flowing through the light-emitting diode D is controlled, thereby displaying an image. The light-emitting diode D emits light due to the current supplied through the driving thin film transistor Td from the high voltage supply VDD.

Namely, the amount of the current flowing through the light-emitting diode D is proportional to the magnitude of the data signal, and the intensity of light emitted by the light-emitting diode D is proportional to the amount of the current flowing through the light-emitting diode D. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode D to be constant and the gray level shown by the light-emitting diode D to be maintained until a next frame.

Meanwhile, a thin film transistor and a capacitor other than the switching and the driving thin film transistors Ts and Td and the storage capacitor Cst may be further added in the pixel region P.

That is, in the electroluminescent display device, the data signal is applied to the gate electrode of the driving thin film transistor Td, and the driving thin film transistor Td is turned on for a relatively long time while the light-emitting diode D emits light to display the gray level. The driving thin film transistor Td may be deteriorated due to the data signal applied for a long time. Accordingly, the mobility and/or threshold voltage Vth of the driving thin film transistor Td are changed, and the pixel region P of the electroluminescent display device displays a different gray level with respect to the same data signal. This causes non-uniform brightness, and the image quality of the electroluminescent display device is lowered.

Therefore, to compensate the change of the mobility and/or threshold voltage of the driving thin film transistor Td, at least one sensing thin film transistor and/or capacitor may be further added in each pixel region to sense the voltage change, and the sensing thin film transistor and/or capacitor may be connected to a reference line for applying a reference voltage and outputting a sensing voltage.

Figure 2:
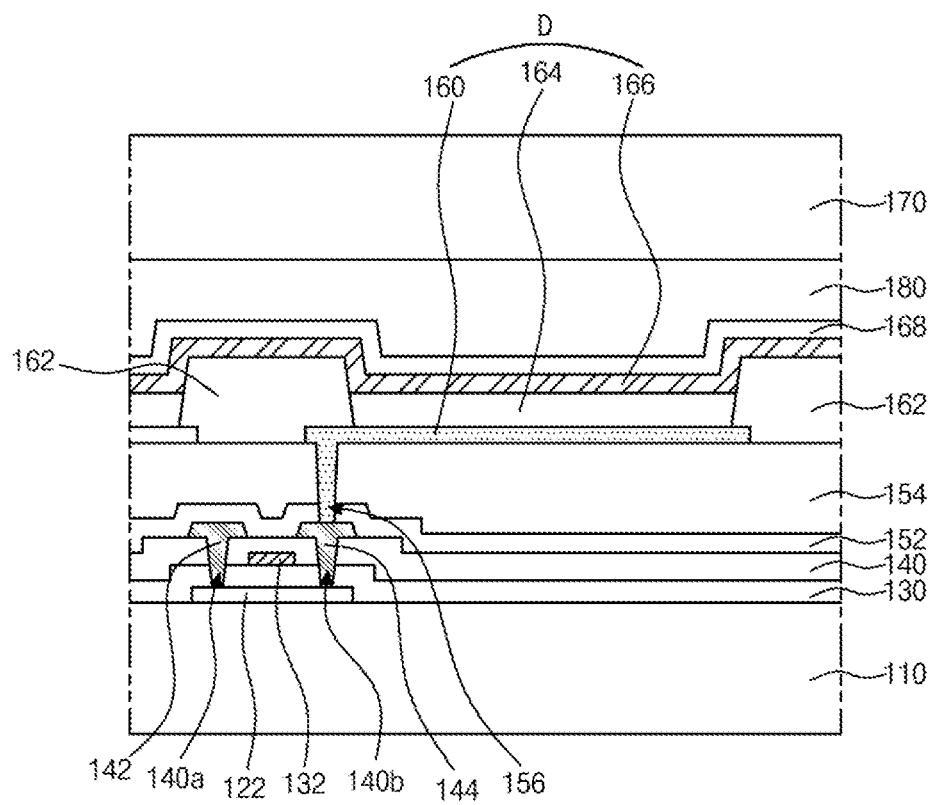
FIG. 2 is a schematic cross-sectional view of an electroluminescent display device according to the embodiment of the present disclosure.

FIG. 2 is a schematic cross-sectional view of an electroluminescent display device according to the embodiment of the present disclosure and shows one pixel region.

In FIG. 2, a semiconductor layer 122 which is patterned is formed on a substrate 110. The substrate 110 may be a glass substrate or a plastic substrate. For example, polyimide may be used for the plastic substrate, but the present disclosure is not limited thereto.

Here, a buffer layer (not shown) may be further formed between the substrate 110 and the semiconductor layer 122.

The semiconductor layer 122 may be formed of an oxide semiconductor material, and in this case, a light-blocking layer (not shown) may be further formed under the semiconductor layer 122. The light-blocking layer blocks light incident on the semiconductor layer 122, thereby preventing the semiconductor layer 122 from being degraded due to the light. Alternatively, the semiconductor layer 122 may be formed of polycrystalline silicon, and in this case, impurities may be doped in both side portions of the semiconductor layer 122.

A gate insulating layer 130 of an insulating material is formed on the semiconductor layer 122 substantially all over the substrate 110. The gate insulating layer 130 may be formed of an inorganic insulating material such as silicon oxide ($SiO_2$). Alternatively, when the semiconductor layer 122 is formed of polycrystalline silicon, the gate insulation layer 130 may be formed of silicon oxide ($SiO_2$) or silicon nitride (SiNx).

A gate electrode 132 is formed on the gate insulating layer 130 corresponding to a central portion of the semiconductor layer 122. The gate electrode 132 may be formed of a conductive material such as metal. In addition, a gate line (not shown) and a first capacitor electrode (not shown) may be formed on the gate insulating layer 130. The gate line extends in a first direction, and the first capacitor electrode is connected to the gate electrode 132.

Meanwhile, in the embodiment of the present disclosure, the gate insulating layer 130 is formed substantially all over the substrate 110. However, the gate insulating layer 130 may be patterned to have the same shape as the gate electrode 132.

An interlayer insulating layer 140 of an insulating material is formed on the gate electrode 132 substantially all over the substrate 110. The interlayer insulating layer 140 may be formed of an inorganic insulating material such as silicon oxide ($SiO_2$) or silicon nitride (SiNx) or formed of an organic insulating material such as photo acryl or benzocyclobutene.

The interlayer insulating layer 140 has first and second semiconductor contact holes 140a and 140b exposing upper surfaces of both side portions of the semiconductor layer 122. The first and second semiconductor contact holes 140a and 140b are disposed at both sides of the gate electrode 132 and spaced apart from the gate electrode 132. Here, the first and second semiconductor contact holes 140a and 140b are also formed in the gate insulating layer 130. Alternatively, when the gate insulating layer 130 is patterned to have the same shape as the gate electrode 132, the first and second semiconductor contact holes 140a and 140b are formed only in the interlayer insulating layer 140.

Source and drain electrodes 142 and 144 are formed of a conductive material such as metal on the interlayer insulating layer 140. In addition, a data line (not shown), a power line (not shown) and a second capacitor electrode are formed on the interlayer insulating layer 140. The data line extends in a second direction crossing the first direction. The power line may be parallel to the data line.

The source and drain electrodes 142 and 144 are spaced apart from each other with respect to the gate electrode 132. The source and drain electrodes 142 and 144 directly contact the both side portions of the semiconductor layer 122 though the first and second semiconductor contact holes 140a and 140b, respectively. Although not shown, the data line extends in the second direction and crosses over the gate line to define each pixel region, and the power line for supplying a high potential voltage is spaced apart from the data line. The second capacitor electrode is connected to the drain electrode 144 and overlaps the first capacitor electrode. The first and second capacitor electrodes form a storage capacitor with the interlayer insulating layer 140 interposed therebetween as a dielectric.

Meanwhile, the semiconductor layer 122, the gate electrode 132, and the source and drain electrodes 142 and 144 constitute a thin film transistor. Here, the thin film transistor has a coplanar structure in which the gate electrode 132 and the source and drain electrodes 142 and 144 are disposed at one side of the semiconductor 122, that is, over the semiconductor layer 122.

Alternatively, the thin film transistor may have an inverted staggered structure in which the gate electrode is disposed under the semiconductor layer and the source and drain electrodes are over the semiconductor layer. In this case, the semiconductor may be formed of amorphous silicon.

Here, the thin film transistor is a driving thin film transistor of the electroluminescent display device, and a switching thin film transistor (not shown) having the same structure as the driving thin film transistor is further formed in each pixel region on the substrate 110. The gate electrode 132 of the driving thin film transistor is connected to a drain electrode (not shown) of the switching thin film transistor, and the source electrode 142 of the driving thin film transistor is connected to the power line (not shown). In addition, a gate electrode (not shown) and a source electrode (not shown) of the switching thin film transistor are connected to the gate line and the data line, respectively.

Further, a sensing thin film transistor having the same structure as the driving thin film transistor may be further formed in each pixel region.

A first insulating layer 152 and a second insulating layer 154 of an insulating material are sequentially formed on the source and drain electrodes 142 and 144 substantially all over the substrate 110. The first insulating layer 152 may be formed of an inorganic insulating material such as silicon oxide ($SiO_2$) or silicon nitride (SiNx), and the second insulating layer 154 may be formed of an organic insulating material such as photo acryl or benzocyclobutene. Accordingly, the second insulating layer 154 may have a flat top surface.

The first insulating layer 152 and the second insulating layer 154 have a drain contact hole 156 exposing the drain electrode 144. Here, the drain contact hole 156 is illustrated as being formed directly over the second semiconductor contact hole 140b. However, the drain contact hole 156 may be formed to be spaced apart from the second semiconductor contact hole 140b.

One of the first insulating layer 152 and the second insulating layer 154 may be omitted, and for example, the first insulating layer 152 formed of an inorganic insulating material may be omitted.

A first electrode 160 of a conductive material having relatively high work function is formed on the second insulating layer 154. The first electrode 160 is formed in each pixel region and contacts the drain electrode 144 through the drain contact hole 156. For example, the first electrode 160 may be formed of a transparent conductive material such as indium tin oxide (ITO) or indium zinc oxide (IZO).

The electroluminescent display device of the present disclosure may be a top-emission type, and in this case, a reflective electrode or a reflective layer of a metallic material having relatively high reflectance may be further formed under the first electrode 160. For example, the reflective electrode or the reflective layer may be formed of aluminum-paladium-copper (APC) alloy or silver (Ag). At this time, the first electrode 160 may have a triple-layered structure of ITO/APC/ITO or ITO/Ag/ITO, but the present disclosure is not limited thereto.

A bank layer 162 of an insulating material is formed on the first electrode 160. The bank layer 162 may be formed of an organic insulating material having a hydrophobic property. The bank layer 162 is disposed between adjacent pixel regions, and the bank layer 162 has a transmissive hole exposing the first electrode 160 and covers an edge of the first electrode 160.

Here, the bank layer 162 is illustrated as having a single-layered structure, but the present disclosure is not limited thereto. For example, the bank layer may have a double-layered structure. That is, the bank layer may include a first bank and a second bank on the first bank, and a width of the first bank may be wider than a width of the second bank. At this time, the first bank may be formed of an inorganic insulating material or an organic insulating material having a hydrophilic property, and the second bank may be formed of an organic insulating material having a hydrophobic property.

A light-emitting layer 164 is formed on the first electrode 160 exposed through the transmissive hole of the bank layer 162. Although not shown, the light-emitting layer 164 may include a hole auxiliary layer, a light-emitting material layer and an electron auxiliary layer sequentially disposed on the first electrode 160. The light-emitting material layer may be formed of an organic luminescent material such as a phosphorescent compound or a fluorescent compound or an inorganic luminescent material such as a quantum dot.

Here, the hole auxiliary layer, the light-emitting material layer and the electron auxiliary layer may be formed through a soluble process. Accordingly, the manufacturing process may be simplified, and a display device with a large size and high definition can be provided. For example, a spin coating method, an inkjet printing method or a screen printing method can be used for the soluble process.

Alternatively, the hole auxiliary layer, the light-emitting material layer and the electron auxiliary layer may be formed through a vacuum evaporation process.

In another case, the hole auxiliary layer, the light-emitting material layer and the electron auxiliary layer may be formed through a combination of the soluble process and the vacuum evaporation process.

The hole auxiliary layer may include at least one of a hole injecting layer (HIL) and a hole transporting layer (HTL), and the electron auxiliary layer may include at least one of an electron injecting layer (EIL) and an electron transporting layer (ETL).

In the drawing, the light-emitting layer 164 is illustrated as being formed only on the first electrode 160 surrounding the bank layer 162. However, the light-emitting layer 164 may be formed substantially all over the substrate 110. That is, the light-emitting layer 164 may also be formed on an upper surface and side surfaces of the bank layer 162.

A second electrode 166 of a conductive material having relatively low work function is formed on the light-emitting layer 164 substantially all over the substrate 110. Here, the second electrode 166 may be formed of aluminum (Al), magnesium (Mg), silver (Ag) or their alloy.

The first electrode 160, the light-emitting layer 164 and the second electrode 166 constitute a light-emitting diode D. The first electrode 160 serves as an anode, and the second electrode 166 functions as a cathode.

As described above, the electroluminescent display device of the present disclosure may be a top-emission type in which light from the light-emitting layer 164 is output to the outside through the second electrode 166, and the second electrode 166 can have a relatively thin thickness to allow light to pass therethrough. Therefore, the electroluminescent display device of the present disclosure can have a larger emission area for the same size, thereby increasing the brightness and decreasing the power consumption.

At this time, the light-emitting diode D can have an element thickness corresponding to a micro-cavity effect. Thus, the optical efficiency can be increased.

A passivation layer 168 is formed on the second electrode 166 substantially all over the substrate 110. The passivation layer 168 may be formed of an inorganic insulating material such as silicon oxide ($SiO_2$) or silicon nitride (SiNx).

Meanwhile, a cover substrate 170 is disposed over and spaced apart from the substrate 110 on which the passivation layer 168 is formed. The cover substrate 170 may be a glass substrate or a plastic substrate. For example, polyimide may be used for the plastic substrate, but the present disclosure is not limited thereto.

A filler layer 180 is disposed between the cover substrate 170 and the passivation layer 168. The filler layer 180 may be formed of a photocurable or thermosetting material. In addition, the filer layer 180 may include a moisture absorbent and block moisture or oxygen introduced from the outside, thereby protecting the light-emitting diode D.

To apply signals to the thin film transistor and the light-emitting diode D in the pixel region, the electroluminescent display device includes a plurality of components in the non-display area, and this will be described with reference to FIG. 3.

Figure 3:
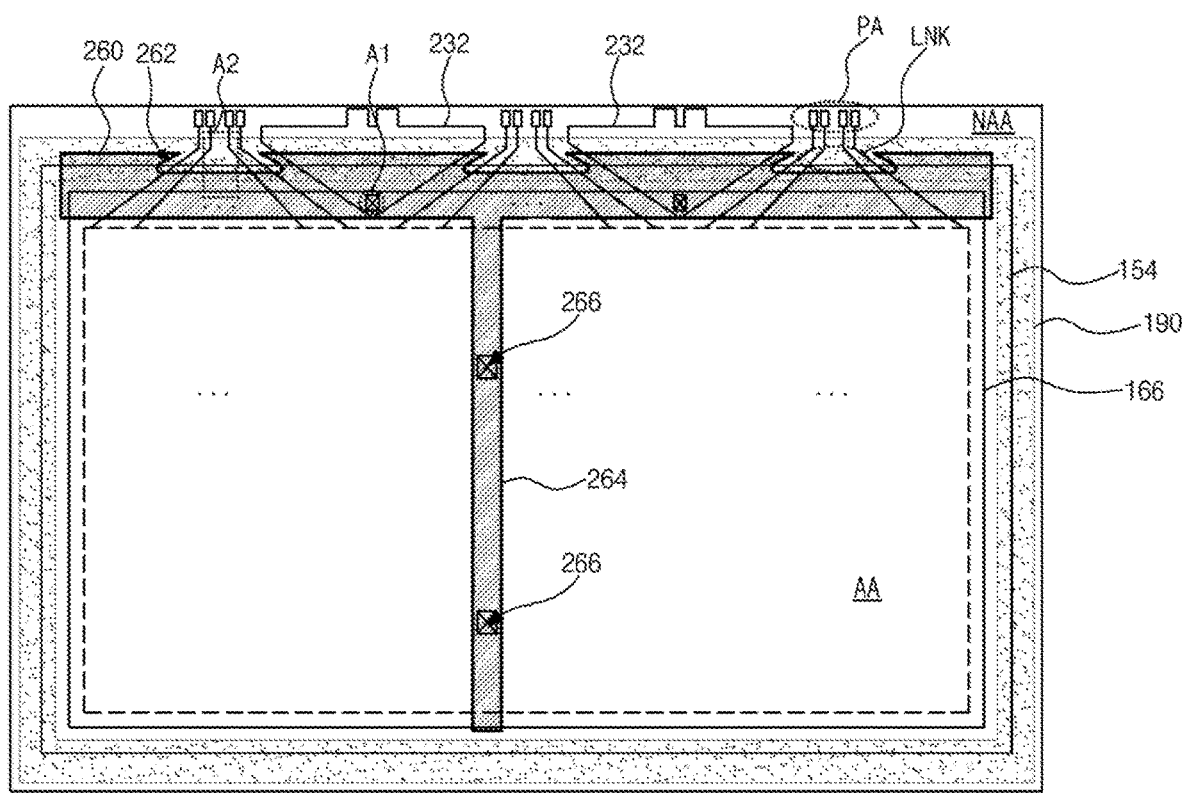
FIG. 3 is a schematic view of an electroluminescent display device according to the embodiment of the present disclosure.

FIG. 3 is a schematic view of an electroluminescent display device according to the embodiment of the present disclosure.

In FIG. 3, the electroluminescent display device according to the embodiment of the present disclosure includes the display area AA and the non-display area NAA which are defined on the substrate 110 of FIG. 2, and a seal pattern 190 is formed in the non-display area NAA. The seal pattern 190 surrounds the display area AA and attaches the substrate 110 of FIG. 2 and the cover substrate 170 of FIG. 2.

As described above, the plurality of pixel regions is disposed in the display area AA, and each pixel region can have the configuration shown in FIG. 1 and FIG. 2.

That is, the plurality of gate lines GL of FIG. 1 and the plurality of data lines DL of FIG. 1 cross over each other to define the plurality of pixel regions P of FIG. 1, and the thin film transistors Ts and Td of FIG. 1, the capacitor Cst of FIG. 1 and the light-emitting diode D of FIG. 2 are disposed in each pixel region P of FIG. 1. At this time, as shown, the second electrode 166 of the light-emitting diode D of FIG. 2 is formed substantially all over the display area AA and extends into the non-display area NAA to be spaced apart from the seal pattern 190.

Further, the power line (not shown), which is connected to the source electrode 142 of FIG. 2 of the driving thin film transistor Td of FIG. 1 and supplies the high potential voltage VDD to the first electrode 160 of FIG. 2 of the light-emitting diode D of FIG. 2, is further formed in the display area AA. The power line may be parallel to the data line DL of FIG. 1.

In addition, the sensing thin film transistor (not shown) may be further formed in each pixel region P of FIG. 1 of the display area AA, and a reference line (not shown), which applies a reference voltage to the sensing thin film transistor and outputs a sensing voltage, may be further formed to be parallel with the data line DL of FIG. 1.

In the meantime, the second insulating layer 154, which covers the thin film transistors Ts and Td of FIG. 1 and is formed of an inorganic insulating material, is disposed substantially all over the display area AA and extends into the non-display area NAA to overlap the seal pattern 190. At this time, the seal pattern 190 covers an edge of the second insulating layer 154.

Since the second insulating layer 154 has relatively high moisture permeability, moisture can easily permeate through the second insulating layer 154 when the second insulating layer 154 is exposed to the outside. Thus, the edge of the second insulating layer 154 is covered with the seal pattern 190 to prevent moisture from permeating. At this time, the edge of the second insulating layer 154, preferably, is spaced apart from an outer surface of seal pattern 190 with a predetermined distance therebetween. Accordingly, it is beneficial that a distance between the outer surface of the seal pattern 190 and the edge of the second insulating layer 154 is greater than a distance between an inner surface of the seal pattern 190 and the edge of the second insulating layer 154.

In the non-display area NAA corresponding to one side of the display area AA, a pad portion PA and a link portion LNK are provided to apply signals to the lines of the display area AA. The pad portion PA is connected to an external driving circuit (not shown), and the link portion LNK connects the pad portion PA to the lines of the display area AA. At this time, each of the pad portion PA and the link portion LNK is divided into a plurality of groups, and each group can be connected to one driving circuit.

Here, the link portion LNK can include a first link line and a second link line. The first link line is connected to the power line of the display area AA so that the high potential voltage VDD applied from the driving circuit through the pad portion PA is supplied to the first electrode 160 of FIG. 2 of the light-emitting diode D of FIG. 2. On the other hand, the second link line is connected to the data line DL of FIG. 1 of the display area AA so that a data signal applied from the driving circuit through the pad portion PA is supplied to the switching thin film transistor Ts of FIG. 1. Further, the link portion LNK may further include a link line for applying another signal, and the structure of the link portion LNK will be described in detail later.

Meanwhile, a first pattern 232 is disposed between two adjacent groups of the link portion LNK in the non-display area NAA in order to apply a low potential voltage VSS to the second electrode 166 of the light-emitting diode D of FIG. 2. The first pattern 232 may have a width that narrows from the non-display area NAA toward the display area AA. On the other hand, the link portion LNK has a width that increases from the non-display area NAA toward the display area AA. That is, a distance between adjacent link lines increases from the non-display area NAA toward the display area AA.

The link portion LNK and the first pattern 232 may be formed of the same material and on the same layer. For example, the link portion LNK and the first pattern 232 may be formed of the same material and on the same layer as the gate electrode 132 of FIG. 2, but the present disclosure is not limited thereto.

In addition, a conductive pattern 260, which overlaps the link portion LNK and the first pattern 232, is formed in the non-display area NAA. The conductive pattern 260 may be formed of the same material and on the same layer as the first electrode 160 of FIG. 2 of the light-emitting diode D of FIG. 2.

The conductive pattern 260 of the present disclosure overlaps and contacts the second electrode 166 which extends into the non-display area NAA and is connected to the first pattern 232 through a contact hole. Accordingly, the low potential voltage VSS applied through the first pattern 232 is supplied to the second electrode 166 through the conductive pattern 260. The connection structure of the first pattern 232, the conductive pattern 260 and the second electrode 166 will be described in detail later.

The conductive pattern 260 covers the edge of the second insulating layer 154. As described above, since the second insulating layer 154 has relatively high moisture permeability, the conductive pattern 260 covers the edge of the second insulating layer 154 so that moisture is prevented from permeating. Namely, the conductive pattern 260 may cover an upper surface and a side surface of the second insulating layer 154.

In the meantime, the conductive pattern 260 of the present disclosure has an opening 262 corresponding to the link portion LNK. Therefore, the edge of the second insulating layer 154 corresponding to the link portion LNK is exposed through the opening 262 of the conductive pattern 260.

Here, the opening 262 may have a width increasing from the non-display area NAA toward the display area AA.

Further, the opening 262 may have a curved corner adjacent to the display area AA. When the corner of the opening 262 adjacent to the display area AA has an angle, currents may be concentrated, and heat may be generated. Accordingly, in the present disclosure, the corner of the opening 262 adjacent to the display area AA is configured to be curved, and currents can be prevented from being concentrated.

Meanwhile, in the display area AA, at least one auxiliary pattern 264 may be further formed of the same material and on the same layer as the conductive pattern 260. The auxiliary pattern 264 contacts the second electrode 166 through a contact hole 266 to lower the resistance so that the low potential voltage VSS is uniformly applied across the entire display area AA. The contact hole 266 may be formed in plural at a plurality of locations, but the present disclosure is not limited thereto. The auxiliary pattern 264 and the contact hole 266 may be omitted.

As described above, in the electroluminescent display device of the present disclosure, the low potential voltage VSS is applied to the second electrode 166 of the light-emitting diode D of FIG. 2 through the first pattern 232 and the conductive pattern 260, and the connection structure for this will be described with reference to FIG. 4.

Figure 4:
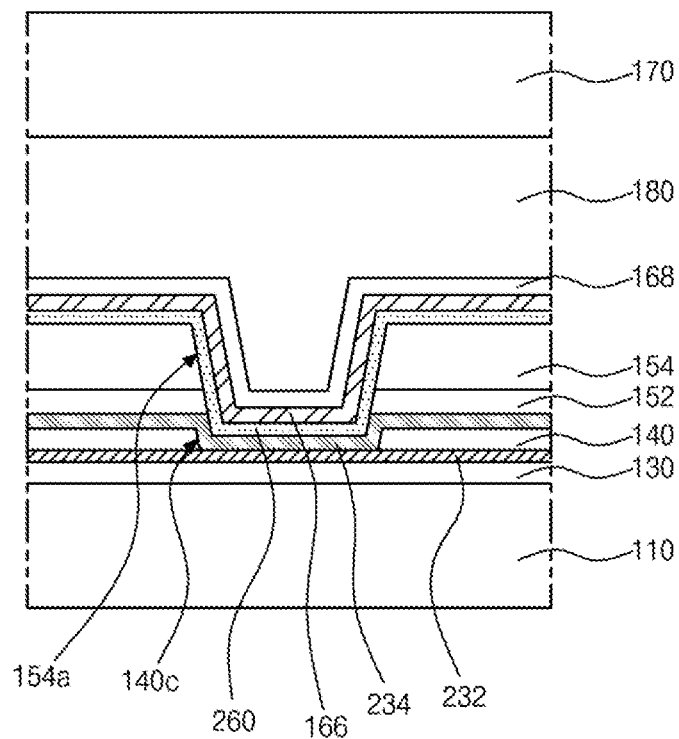
FIG. 4 is a schematic cross-sectional view of a non-display area of an electroluminescent display device according to the embodiment of the present disclosure.

FIG. 4 is a schematic cross-sectional view of a non-display area of an electroluminescent display device according to the embodiment of the present disclosure and shows a cross-section corresponding to the area A1 of FIG. 3.

In FIG. 4, the gate insulating layer 130 is formed on the substrate 110, and the first pattern 232 is formed on the gate insulating layer 130. The first pattern 232 may be formed of the same material and through the same process as the gate electrode 132 of FIG. 2.

The interlayer insulating layer 140 is formed on the first pattern 232, and the interlayer insulating layer 140 has a first contact hole 140c exposing the first pattern 232.

A second pattern 234 is formed on the interlayer insulating layer 140. The second pattern 234 may be formed of the same material and through the same process as the source and drain electrodes 142 and 144 of FIG. 2. The second pattern 234 contacts the first pattern 232 through the first contact hole 140c.

The first insulating layer 152 of an inorganic insulating material and the second insulating layer 154 of an organic insulating material are sequentially formed on the second pattern 234. The first insulating layer 152 and the second insulating layer 154 have a second contact hole 154a exposing the second pattern 234. At this time, the second contact hole 154a may be formed to correspond to the first contact hole 140c.

Next, the conductive pattern 260 is formed on the second insulating layer 154. The conductive pattern 260 contacts the second pattern 234 through the second contact hole 154a. The conductive pattern 260 may be formed of the same material and through the same process as the first electrode 160 of FIG. 2 of the light-emitting diode D of FIG. 2.

Meanwhile, the second pattern 234 is to lower the step difference for the contact between the conductive pattern 260 and the first pattern 232, and the second pattern 234 may be omitted. In this case, the second contact hole 154a may expose the first pattern 232 with the first contact hole 140c, and the conductive pattern 260 may contact the first pattern 232 through the first and second contact holes 140c and 154a.

In the present disclosure, the first and second contact holes 140c and 154a are illustrated as being one, but the number of the first and second contact holes 140c and 154a is not limited thereto. The first and second contact holes 140c and 154a may be configured to be in plural.

Next, the second electrode 166 is formed on the conductive pattern 260, and the second electrode 166 overlaps and contacts the conductive pattern 260.

Further, the passivation layer 168 is formed on the second electrode 166, the cover substrate 170 is disposed over the passivation layer 168, and the filler layer 180 is disposed between the passivation layer 168 and the cover substrate 170.

As described above, in the electroluminescent display device according to embodiments of the present disclosure, the second electrode 166 of the light-emitting diode D of FIG. 2 is directly or indirectly connected to first pattern 232, the second pattern 234 and the conductive pattern 260 to receive the low potential voltage VSS.

At this time, since the conductive pattern 260, which overlaps the link portion LNK, has the opening 262, it is possible to prevent the electrical short between the conductive pattern 260 and the link line of the link portion LNK. This will be described with reference to FIG. 5 and FIG. 6.

Figure 5:
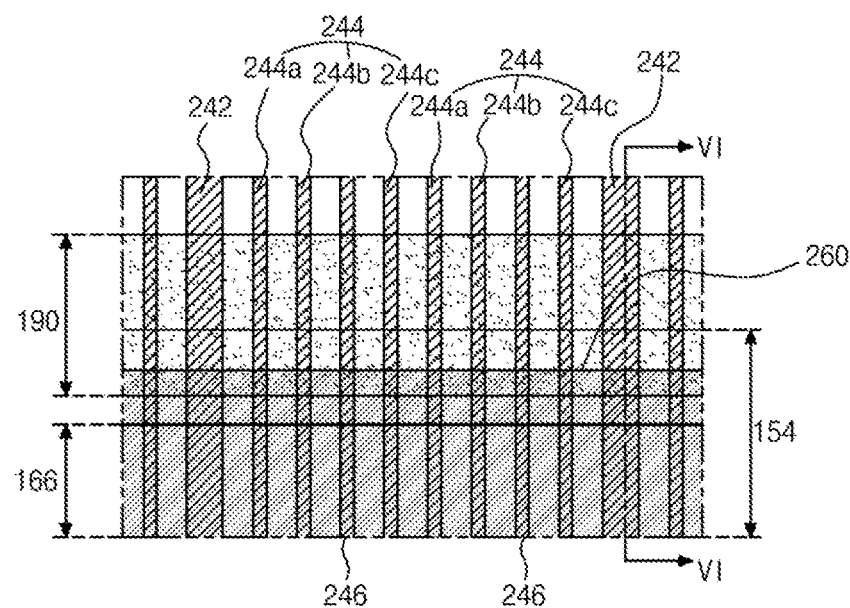
FIG. 5 is a schematic plan view of a non-display area of an electroluminescent display device according to the embodiment of the present disclosure.
Figure 6:
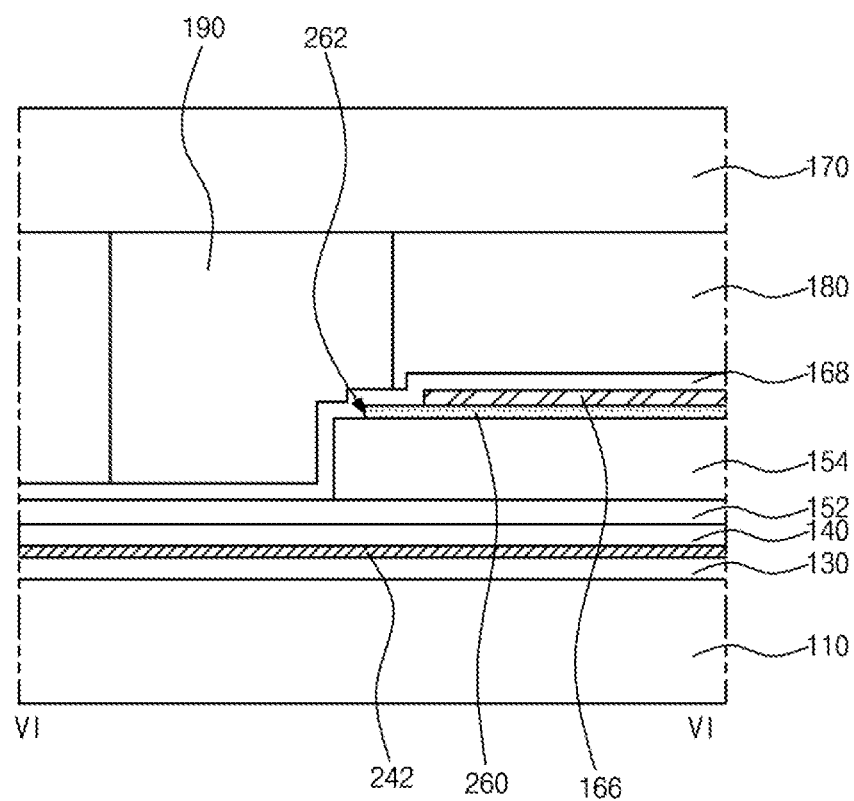
FIG. 6 is a schematic cross-sectional view of a non-display area of an electroluminescent display device according to the embodiment of the present disclosure.

FIG. 5 is a schematic plan view of a non-display area of an electroluminescent display device according to embodiments of the present disclosure, and FIG. 6 is a schematic cross-sectional view of a non-display area of an electroluminescent display device according to embodiments of the present disclosure. FIG. 5 shows a plane corresponding to the area A2 of FIG. 3, and FIG. 6 shows a cross-section corresponding to the line VI-VI of FIG. 5. Here, for convenience of explanation, description will be made together with reference to FIG. 3.

As shown in FIG. 3, FIG. 5 and FIG. 6, the gate insulating layer 130 is formed on the substrate 110, and first, second and third link lines 242, 244 and 246 are formed on the gate insulating layer 130. The first, second and third link lines 242, 244 and 246 may be formed of the same material and through the same process as the gate electrode 132 of FIG. 2.

The first link line 242 is connected to the power line of the display area AA so that the high potential voltage VDD applied from the driving circuit through the pad portion PA of FIG. 3 is supplied to the first electrode 160 of FIG. 2 of the light-emitting diode D of FIG. 2.

The second link line 244 is connected to the data line DL of FIG. 1 of the display area AA so that the data signal applied from the driving circuit through the pad portion PA is supplied to the switching thin film transistor Ts of FIG. 1. The second link line 244 may include first, second and third data links 244a, 244b and 244c connected to the data lines of red, green and blue sub pixels, respectively.

The third link line 246 is connected to the reference line (not shown) of the display area AA to apply the reference voltage and output the sensing voltage.

Here, the first link line 242 provides a higher potential voltage than the second and third link lines 244 and 246, and the first link line 242 may have a wider width than the second and third link lines 244 and 246.

A plurality of second link lines 244 and a plurality of third link lines 246 may be disposed between adjacent first link lines 242. For example, two second link lines 244 and two third link lines 246 may be disposed between the adjacent first link lines 242. At this time, the first data link 244a, the second data link 244b, the third link line 246 and the third data link 244c may be sequentially and repeatedly arranged, but the present disclosure is not limited thereto.

Next, the interlayer insulating layer 140 is formed on the first, second and third link lines 242, 244 and 246, and the first insulating layer 152 and the second insulating layer 154 are sequentially formed on the interlayer insulating layer 140.

At this time, the second insulating layer 154 exposes an upper surface of the first insulating layer 152 disposed over one ends of the first, second and third link lines 242, 244 and 246. That is, an edge of the second insulating layer 154 is disposed on the first insulating layer 152 over the first, second and third link lines 242, 244 and 246.

Next, the conductive pattern 260 is formed on the second insulating layer 154. The conductive pattern 260 partially overlaps the first, second and third link lines 242, 244 and 246.

The conductive pattern 260 has the opening 262 corresponding to the first, second and third link lines 242, 244 and 246, and the edge of the second insulating layer 154 is exposed through the opening 262 of the conductive pattern 260.

Next, the second electrode 166 is formed on the conductive pattern 260. The second electrode 166 overlaps and contacts the conductive pattern 260. Here, an edge of the second electrode 166 is disposed on the conductive pattern 260.

Then, the passivation layer 168 is formed on the second electrode 166, and the cover substrate 170 is disposed over the passivation layer 168. The seal pattern 190 and the filler layer 180 are formed between the passivation layer 168 and the cover substrate 170, and the seal pattern 190 surrounds the filler layer 180.

Here, the seal pattern 190 overlaps the first, second and third link lines 242, 244 and 246 and also overlaps the edges of the second insulating layer 154 and the conductive pattern 260. In addition, the seal pattern 190 is spaced apart from the edge of the second electrode 166.

As described above, in the electroluminescent display device according to embodiments of the present disclosure, the conductive pattern 260 connected to the second electrode 166 has the opening 262 corresponding to the first, second and third link lines 242, 244 and 246. The edge of the second insulating layer 154 is exposed through the opening 262, and the edge of the conductive pattern 260 corresponding to the opening 262 is disposed on the second insulating layer 154. Thus, since a distance between the conductive pattern 260 and the first, second and third link lines 242, 244 and 246 increases as compared with a case without the opening 262, it is possible to prevent an electrical short between the conductive pattern 260 and the first, second and third link lines 242, 244 and 246 even if particles are generated due to the seal pattern 190. Therefore, ignition can be prevented, and the safety can be improved.

In the present disclosure, since the electroluminescent display device is a top-emission type, the electroluminescent display device a wider emission area than a display device having the same size. Accordingly, the brightness can be improved, and the power consumption can be lowered.

Additionally, in the electroluminescent display device of the present disclosure, it is possible to prevent the electrical short between the link line connected to the first electrode of the light-emitting diode and the conductive pattern connected to the second electrode of the light-emitting diode.

Therefore, ignition can be prevented, and the safety can be improved.

It will be apparent to those skilled in the art that various modifications and variations can be made in a display device of the present disclosure without departing from the sprit or scope of the embodiments. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
 a substrate on which a display area and a non-display area are defined;
 a thin film transistor in the display area on the substrate;
 a light-emitting diode connected to the thin film transistor and including a first electrode, a light-emitting layer, and a second electrode;
 a first link line disposed in the non-display area and configured to apply a first voltage to the first electrode;
 a second link line spaced apart from the first link line in the non-display area; and
 a conductive pattern disposed in the non-display area and connected to the second electrode to apply a second voltage, the conductive pattern having an opening corresponding to the first and second link lines,
 wherein the conductive pattern is formed of a same material and on a same layer as the first electrode.

2. The electroluminescent display device of claim 1, wherein the opening has a width that increases from the non-display area toward the display area.

3. The electroluminescent display device of claim 2, wherein a corner of the opening adjacent to the display area is curved.

4. The electroluminescent display device of claim 1, further comprising an organic insulating layer between the first and second link lines and the conductive pattern, wherein the conductive pattern covers an edge of the organic insulating layer and the edge of the organic insulating layer is exposed through the opening.

5. The electroluminescent display device of claim 4, further comprising:
 a cover substrate disposed over and spaced apart from the substrate; and
 a seal pattern between the substrate and the cover substrate in the non-display area,
 wherein the seal pattern overlaps the edge of the organic insulating layer.

6. The electroluminescent display device of claim 1, further comprising a gate line and a data line electrically connected to the thin film transistor in the display area, wherein the second data link line is connected to the data line.

7. The electroluminescent display device of claim 1, further comprising a first pattern overlapping the conductive pattern and electrically connected to the conductive pattern in the non-display area, wherein the first pattern is formed of a same material and on a same layer as the first link line.

8. The electroluminescent display device of claim 7, wherein the first pattern has a width that decreases from the non-display area toward the display area.

9. The electroluminescent display device of claim 7, wherein the first pattern and the first link line are formed of a same material and on a same layer as a gate electrode of the thin film transistor.

10. The electroluminescent display device of claim 9, further comprising a second pattern disposed between the conductive pattern and the first pattern and connected to the conductive pattern and the first pattern, wherein the second pattern is formed of a same material and on a same layer as source and drain electrodes of the thin film transistor.

11. The electroluminescent display device of claim 1, wherein the conductive pattern overlaps the second electrode.

12. The electroluminescent display device of claim 1, wherein the conductive pattern overlaps the first and second link lines.

13. An electroluminescent display device, comprising:
 a sub pixel in a display area of the display device, the sub pixel including a thin film transistor coupled to a light-emitting diode having a first electrode and a second electrode;
 a first link line in a non-display area of the display device, the first link line configured to provide a first voltage to the first electrode;
 a second link line spaced apart from the first link line in the non-display area; and
 a conductive pattern overlapping the first and second link lines in the non-display area, the conductive pattern configured to provide a reference voltage to the second electrode and including an opening corresponding to the first and second link lines.

14. The electroluminescent display device of claim 13, further comprising an organic insulating layer between each of the first and second link lines and the conductive pattern, the organic insulating layer having an edge exposed in the opening.

15. The electroluminescent display device of claim 13, further comprising a seal pattern on the conductive pattern covering the edge of the organic insulating layer.

16. The electroluminescent display device of claim 13, wherein the conductive pattern overlaps the first and second link lines by a same length.

17. The electroluminescent display device of claim 16, further comprising a third link line spaced apart from the first and second link lines in the non-display area, and wherein the conductive pattern overlaps the first, second and third link lines by the same length.

18. The electroluminescent display device of claim 13, wherein the conductive pattern overlaps the second electrode.

* * * * *